United States Patent [19]

Smith

[11] Patent Number: 4,888,085

[45] Date of Patent: * Dec. 19, 1989

[54] PROCESSES FOR THEIR MANUFACTURE OF MONOLITHICALLY INTEGRATED PLANAR LASERS DIFFERING IN EMISSION WAVELENGTHS

[75] Inventor: Frank T. J. Smith, Pittsford, N.Y.

[73] Assignee: Eastman Kodak Company, Rochester, N.Y.

[ * ] Notice: The portion of the term of this patent subsequent to Nov. 29, 2005 has been disclaimed.

[21] Appl. No.: 908,758

[22] Filed: Sep. 18, 1986

[51] Int. Cl.$^4$ ............................................. C30B 25/04
[52] U.S. Cl. ...................................... 156/613; 437/90; 437/129; 437/133; 437/970
[58] Field of Search ...................................... 437/89–91, 437/129, 133, 107, 970; 372/45, 46, 48; 148/DIG. 29, DIG. 110; 357/16, 17; 156/613

[56] References Cited

U.S. PATENT DOCUMENTS

| | | | |
|---|---|---|---|
| 4,033,796 | 7/1977 | Burnham et al. | 437/91 |
| 4,318,058 | 3/1982 | Mito et al. | 372/50 |
| 4,318,059 | 3/1982 | Lang et al. | 372/47 |
| 4,366,569 | 12/1982 | Hirao et al. | 437/129 |
| 4,509,996 | 4/1985 | Greene et al. | 437/133 |
| 4,532,694 | 8/1985 | Kolbas | 437/129 |
| 4,566,171 | 1/1986 | Nelson et al. | 437/133 |
| 4,577,321 | 3/1986 | Carney et al. | 372/45 |
| 4,645,687 | 2/1987 | Donnelly et al. | 156/613 |
| 4,660,208 | 4/1987 | Johnston et al. | 437/133 |

FOREIGN PATENT DOCUMENTS

| | | | |
|---|---|---|---|
| 0132408 | 1/1985 | European Pat. Off. | 437/107 |
| 59-41317 | 10/1984 | Japan | 437/129 |

OTHER PUBLICATIONS

Norris et al., "Reduced Pressure MOVPE Growth and Characterization of GaAs/GaAlAs Heterostructures Using a Triethylgallium Source", J. Crys. Growth 68 (1984) pp. 437–444.

Botez, "Laser Diodes are Power-Packed", IEEE Spectrum, Jun. 1985, pp. 43–53.

Ghosh et al., "Selective Area Growth of Gallium Arsenide by Metalorganic Vapor Phase Epitaxy," App. Phys. Lett. 45(11), Dec. 1, 1984, pp. 1229–1231.

Tokumitsu et al., "Molecular Beam Epitaxial Growth of GaAs Using Trimethylgallium as a Ga Source," J. App. Phys. 55(8), Apr. 15, 1984, pp. 3163–3165.

Kamon et al., "Selective Epitaxial Growth of GaAs by Low Pressure MOVPE," Journal of Crystal Growth 73 (1985) pp. 73–76.

Kamon et al., "Selective Embedded Growth of AlGaAs by Low-Pressure Organometallic Vapor Phase Epitaxy", Japanese Journal of Applied Physics, 25(1), Jan. 1, 1986, pp. L10–L12.

Primary Examiner—John Doll
Assistant Examiner—R. Bruce Breneman
Attorney, Agent, or Firm—Carl O. Thomas

[57] ABSTRACT

Lasers differing in emission wavelengths are disclosed monolithically integrated in a common substrate providing positive index guiding of adjacent lasers. The lasers and the substrate together present a planar semiconductive surface.

The monolithically integrated laser structure is formed by providing laterally offset channels in a planar substrate surface and selectively depositing cladding and active layers in the channels, with the composition of at least one of the cladding and active layers in one channel differing from that in another.

16 Claims, 2 Drawing Sheets

PROCESSES FOR THEIR MANUFACTURE OF MONOLITHICALLY INTEGRATED PLANAR LASERS DIFFERING IN EMISSION WAVELENGTHS

FIELD OF THE INVENTION

This invention is directed to processes for the manufacture of semiconductor lasers, specifically monolithically integrated lasers.

BACKGROUND OF THE INVENTION

It has been a problem of long standing in preparing monolithically integrated semiconductor components (also referred to as chips) to integrate two or more lasers capable of emitting at differing wavelengths while at the same time obtaining chips presenting planar surfaces—i.e., surfaces having the low level of relief common to semiconductor devices fabricate using planar processing. Planar surfaces exhibit a relief variance of a micrometer ($\mu$m) or less.

When monocrystalline semiconductive substrates exhibit surface relief in excess of about 1 $\mu$m, particularly when these relief differences are exhibited by next adjacent chip components, manufacturing difficulties arise leading to reduced yields. As the relief differences between adjacent chip elements increase, the slope of connecting surfaces of the substrate increases, shifting from a horizontal orientation toward a vertical orientation. As the surface orientations become increasingly sloped, the choice of techniques by which overlying layers, such as insulative or conductive layers, can be deposited reliably is reduced. Additionally, increased relief differences impose localized reduced radii of curvature on overlying layers. It is at these sites in overlying layers that coating non-uniformities are most common. Further, it is at the low radius of curvature layer locations that stress defects, such as those attributable to differences in thermal expansion characteristics, are most likely to occur.

It is known in the art that a laser can be formed by planar processing. Such lasers are formed by introducing along a substrate surface N and P conductivity type ions in laterally spaced regions so that an active region is created therebetween. While such lasers are ideal in terms of achieving an overall planar surface for a chip, emission efficiency of such lasers is relatively low.

For this reason lasers are normally constructed by epitaxial growth of superimposed layers. Botez, "Laser Diodes are Power-Packed", IEEE Spectrum, June 1985, pp. 43-53, provides a state of the art survey of such laser diodes as discrete elements. Positive index lasers are disclosed and schematically illustrated. Lasers can be formed with only three superimposed layers, superimposed N and P conductivity type cladding layers with an active layer intervening. Efficient lasers are typically formed with five or more superimposed layers. Botez discusses only discrete lasers and monolithically integrated laser arrays emitting at a single wavelength.

Attempts to form integrated circuits containing more than one laser having superimposed layers and with the lasers having the capability of emitting at differing wavelengths has led to constructions in which the layers of one laser are superimposed on the layers of another laser. As might be expected, this leads to exceptionally high surface relief. Lang et al U.S. Pat. No. 4,318,059 is representative of this approach.

Mito et al U. S. Pat. No. 4,318,058 discloses laterally related lasers integrated on a common chip capable of emitting at differing wavelengths. Mito et al deposits III-V compound layers on a substrate by molecular beam epitaxy while varying the III-V compound composition during an electron beam sweep across the substrate surface. An inherent disadvantage of the Mito et al process is that molecular beam deposition is slow as compared to organometallic vapor epitaxial deposition. The disadvantage of the Mito et al structure produced is that one lasing region as initially formed grades smoothly into the next laterally adjacent lasing region. Mito et al discloses a III-V compound laser formed using arsenic as group V ions and aluminum and gallium as group III ions in which adjacent lasing regions are separated by etch troughs. Thus, the overall topography of the chip is a mesa topography rather than a planar topography. Mito et al discloses an alternative planar construction using indium as group III ions and phosphorus as group V ions and resorting to implanting proton radiation insulated regions for isolation in the epitaxy between adjacent lasers. Besides the obvious laser disadvantages of this approach, no substrate surface between adjacent laser is available for integration of other, non-laser chip components. The highly doped proton radiation insulated regions are, of course, poorly suited to serving as fabrication areas for many types of circuit components.

Recognizing the difficulties of integrating waveguides such as lasers in multicomponent chips, the art has continued to investigate the properties of waveguide semiconductive materials and the manner in which such materials can be deposited. Ghosh et al, "Selective Area Growth of Gallium Arsenide by Metalorganic Vapor Phase Epitaxy," App. Phys. Lett. 45(11), Dec. 1, 1984, pp. 1229-1231, discloses the selective growth of gallium arsenide by organometallic vapor phase epitaxy on a gallium arsenide substrate partially masked by a silica layer. Tokumitsu et al, "Molecular Beam Expitaxial Growth of GaAs Using Trimethylgallium as a Ga Source," J. App. Phys. 55(8), Apr. 15, 1984, pp. 3163-3165, reports similar selective deposition employing molecular beam epitaxy. Kamon et al, "Selective Epitaxial Growth of GaAs by Low Pressure MOVPE," Journal of Crystal Growth 73 (1985), pp. 73-76, discloses the selective growth of gallium arsenide on gallium arsenide in areas not covered by silica and in "Selective Embedded Growth of AlGaAs by Low-Pressure Organometallic Vapor Phase Epitaxy", Japanese Journal of Applied Physics, 25(1), Jan. 1, 1986, pp. L10-L12, extend their previous disclosure to growing selective gallium aluminum arsenide on an etched substrate.

SUMMARY OF THE INVENTION

In one aspect of this invention is directed to a process of preparing monolithically integrated lasers capable of emitting at differing wavelengths comprising providing a substrate, providing superimposed N and P conductivity type cladding layers separated by an active layer at laterally spaced lasing regions on the substrate, the substrate and the layers together forming a monocrystalline III-V compound structure, wherein the group V ions are arsenic and the group III ions are at least one of gallium and aluminum, and the active layers at two of the lasing regions differ to generate emissions at differing wavelengths.

The process is characterized in that at least two positive index guided lasing regions capable of emitting at differing wavelengths presenting with the substrate a planar surface of the monocrystalline III–V compound structure are formed by (a) providing a substrate having adjacent one major surface monocrystalline gallium aluminum arsenide having a resistivity greater than $10^5$ ohm-cm, (b) providing on the one major surface a protective layer defining a first opening, (c) through the first opening creating a channel in the substrate to expose an unprotected portion of the substrate beneath the one major surface, (d) epitaxially depositing on only the unprotected portion of the substrate a first lasing region comprised of the superimposed N and P conductivity type cladding layers separated by the active layer, the active layer being of a higher refractive index than the substrate monocrystalline gallium aluminum arsenide, (e) terminating epitaxial deposition when the first lasing region forms with the one major surface a planar surface of the III–V compound structure, (f) providing a protective layer at least in the first opening and defining a second protective layer opening laterally offset from the first opening, (g) through the second opening creating a channel in the substrate to expose a second, laterally offset unprotected portion of the substrate beneath the one major surface, (h) epitaxially depositing on only the laterally offset unprotected portion of the substrate a second lasing region comprised of the superimposed N and P conductivity type cladding layers separated by the active layers of a higher refractive index than the substrate monocrystalline gallium aluminum arsenide, the active layer of the second laser region differing from the active layer of the first lasing region to generate emissions at a differing wavelength, and (i) terminating epitaxial deposition when the second lasing region forms with the one major surface a planar surface of the III–V compound structure.

In another aspect of this invention is directed to monolithically integrated lasers capable of emitting at differing wavelengths comprised of a substrate having a major surface, a plurality of laterally spaced lasing regions adjacent the substrate major surface, each of the lasing regions comprising superimposed P and N conductivity type cladding layers and an active layer therebetween, the substrate and the layers together forming a monocrystalline III–V compound structure, wherein the group V ions are arsenic and the group III ions are at least one of gallium and aluminum, and the active layers of the lasing regions differing to generate emissions at differing wavelengths.

The monolithically integrated lasers are characterized in that the substrate forms with the two lasing regions a planar surface of the monocrystalline III–V compound structure and the substrate comprises monocrystalline gallium aluminum arsenide of a single conductivity type having a resistivity of greater than $10^5$ ohm-cm laterally separating the two lasing regions and providing positive index wave guiding at its interface with the two active layers.

The present invention offers a variety of advantages over processes heretofore employed in the art for fabricating monolithically integrated lasers emitting at differing wavelengths. First, chips with planar surfaces can be readily achieved. Second, the selective deposition of the laser-forming III–V compound at desired laser sites is reliably achieved. It is not necessary to etch away large portions of the substrate in other than laser areas nor to build up epitaxially these other areas after the laser structure is formed in order to achieve the desired planar surface structure. Third, the above advantages can be realized while at the same time choosing the initial composition of the substrate to achieve desired positive index waveguide and electrical isolation characteristics. The process is compatible with achieving layers overlying the semiconductive substrate which are more readily and reliably produced.

The monolithically integrated lasers capable of emitting at differing wavelengths of this invention offer advantages over those previously fabricated. First, the lasers present a planar surface with the substrate. This facilitates formation of surface layers, such as conductive and insulative layers and allows these layers to be more reproducibly formed. Second, the substrate portion separating the lasers along the planar surface requires no special modification to isolate adjacent layers and provide positive waveguiding. Further, the substrate adjacent the planar surface is better suited for electrical isolation and for the integration of additional circuit components.

BRIEF DESCRIPTION OF THE DRAWINGS

These and other advantages of this invention can be better appreciated by reference to the following detailed description of the invention considered in conjunction with the drawings, in which.

DESCRIPTION OF PREFERRED EMBODIMENTS

Figure 1:
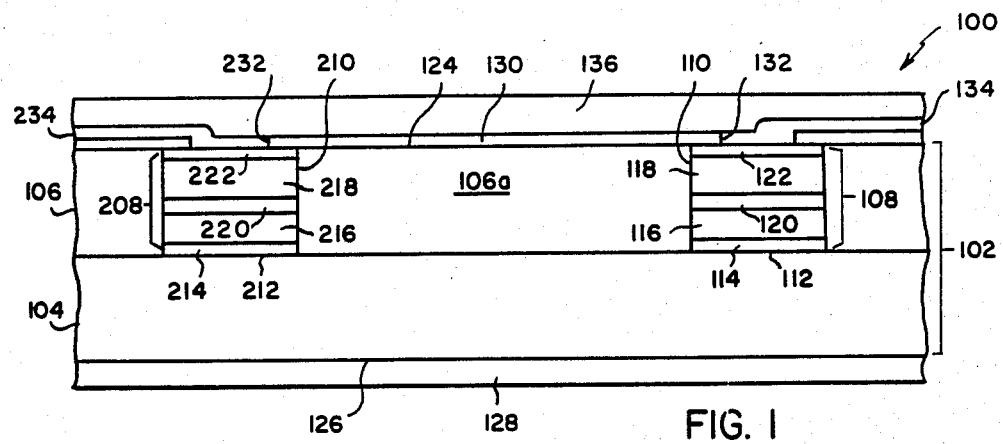
FIG. 1 is a sectional detail of a semiconductor element according to the invention.

In FIG. 1 is shown a detail of an exemplary preferred semiconductor device 100 according to the present invention containing two monolithically integrated lasers capable of emission at differing wavelengths. The device in the detail shown is comprised of a monocrystalline III–V compound structure consisting of a substrate 102 and a laterally spaced first and second lasing regions 108 and 208 epitaxially grown in channels 110 and 210, respectively, of the substrate. A first major surface 124 of the substrate and the upper surface of the lasing regions together form an overall planar surface of the device while the substrate alone forms a second major surface 126 of the device. A first electrode 128 serves as an ohmic contact to the second major surface. An insulative layer 130 overlies the planar surface bridging the isolating portion of the substrate and the lasing regions and forms first and second apertures 132 and 232 overlying the first and second lasing regions. A second and third electrodes 134 and 234 contact the upper surfaces of the first and second lasing regions within the first and second apertures, respectively, and also each laterally traverse at least a portion of the insulative layer. Overlying the second and third electrodes and the insulative layer is an electrically insulative barrier layer 136. It should be noted that though neither the second and third electrodes nor the barrier layer are deposited on a zero relief surface, both are presented with planar surfaces, since the relief variance introduced by providing a apertures through the insulative layer is well within the relief range of a planar surface.

The electrodes and the insulative and barrier layers can be of any convenient conventional composition. Both gold-zinc alloys and titanium nitride are typical electrode materials. The insulative barrier layer is entirely optional, since the device can be mounted in a hermetically sealed housing, if desired. When present, the barrier layer can take the form of a passivating layer, such as a borosilicate glass. The insulative layer can take the form of a chemically vapor deposited insulative material, such as silica or silicon nitride. Additional conductive and/or insulative layers, not shown, can overlie the barrier layer, depending upon the requirements of other, optional device components, not shown.

The substrate 102 in one preferred form is comprised of a more conductive portion 104 typically formed of gallium arsenide containing at least $5 \times 10^{17}$ and preferably from 1 to $3 \times 10^{18}$ N conductivity type ions per cubic centimeter. An isolating portion 106 of the substrate is comprised of an aluminum gallium arsenide layer epitaxially grown on the more conductive portion of the substrate. The isolating portion contains sufficient aluminum to reduce its refractive index below that of the active layers of the lasing regions, which it laterally confines, so that it forms with each of the lasing regions a positive index waveguide. The isolating portion preferably contains about 30 to 60 mole percent aluminum, mole percentages being based on the total group III ions present, except as otherwise indicated. To isolate the lasing regions electrically from any laterally adjacent integrated circuit components, not shown, at least the portion of the substrate adjacent the first major surface exhibits a resistivity of greater than $10^5$ ohm-cm, preferably greater than $10^7$ ohm-cm. Suitable resistivity levels can be achieved by known gallium arsenide deposition techniques, such as by gallium arsenide deposition at temperatures of 550° to 650° C. and/or in an atmosphere containing from 2 to 10 ppm of oxygen. Since the insulating portion need not be relied upon for current conduction, the majority charge carriers can be of either N or P conductivity type or the insulating portion can be substantially intrinsic.

While no elements other than the two lasers are required to be present in the device 100 and therefore are not shown, it is appreciated that the substrate portion adjacent the first major surface is particularly suited to the placement of additional, optional circuit components, desired. The isolating portion 106a laterally separating the lasing regions is a particularly suitable site for additional, optional circuit components, such as additional semiconductive elements.

The lasing regions, lying entirely within the channels formed by the substrate, have their lateral extent defined by the isolating portion of the substrate and their lower walls 112 and 212 defined by the more conductive portion of the substrate. Adjacent the lower channel wall the lasing regions are shown comprised of gallium arsenide lower capping layers 114 and 214, respectively, typically having an N type conductivity ion concentration of from $10^{17}$ to $5 \times 10^{18}$ ions per cubic centimeter. Lying immediately above the lower capping layers are lower cladding layers 116 and 216 of N conductivity type. Lying above the lower cladding layers are upper cladding layers 118 and 218 of P conductivity type. Each cladding layer can be comprised of aluminum arsenide or gallium aluminum arsenide containing up to 90 mole percent gallium. The cladding layers each typically have a conductivity imparting ion concentration of from $10^{16}$ to $10^{18}$ ions per cubic centimeter, but typically each contain a somewhat lower conductivity imparting ion concentration than the capping layer with which it is in contact. Interposed between the upper and lower cladding layers are active layers 120 and 220. The active layers each normally contains a lower conductivity imparting ion concentration than either of the cladding layers it contacts. That is, each cladding layer normally contains less than $10^{18}$ conductivity imparting ions per cubic centimeter and can be as nearly intrinsic as can be conveniently realized. Additionally, each active layer contains less aluminum than either of the cladding layers it contacts and less aluminum than the isolating portion of the substrate.

To cause the first and second lasing regions to emit at differing wavelengths their active layers must differ. It is well known that differing group III ion concentrations of active layers can shift the wavelength of emission. For example, reductions of aluminum concentration in active layers of gallium aluminum arsenide shifts emission to longer wavelengths. It is also known that thinning an active layer reduces its wavelength of emission. Either or both of these parameters of the active layers can be varied to create the desired differences in emission wavelengths.

Capping layers 122 and 222 are in contact with the upper cladding layers 118 and 218, respectively. The upper capping layers are preferably comprised of gallium arsenide having a P type conductivity imparting ion concentration of greater than $10^{19}$ ions per cubic centimeter. The upper surface of the upper capping layers lie along the planar surface of the semiconductor device within a μm and typically within about 3000 Angstroms of the plane of the first major surface of the substrate. As shown the first major surface of the substrate and the upper surfaces of the capping layers are in their ideal, coplanar relationship.

To form the semiconductor device 100 according to the process of the present invention a monocrystalline gallium arsenide wafer is provided having properties corresponding to those of the conductive portion 104 of the substrate. The wafer thickness is chosen to make efficient use of material while permitting manipulation during processing without damage. While in practice a plurality of identical semiconductive devices are formed in laterally offset relation on a single wafer, the description which follows is in terms of forming a single device, since the process steps are the same.

Onto the wafer forming the more conductive portion 104 of the device substrate a monocrystalline layer is epitaxially grown forming the isolating portion 106 of the substrate. The isolating portion is typically grown to a thickness of from about 3 to 10 μm, optimally from about 4 to 8 μm. Formation of the substrate can be achieved by any convenient conventional means.

Figure 2:
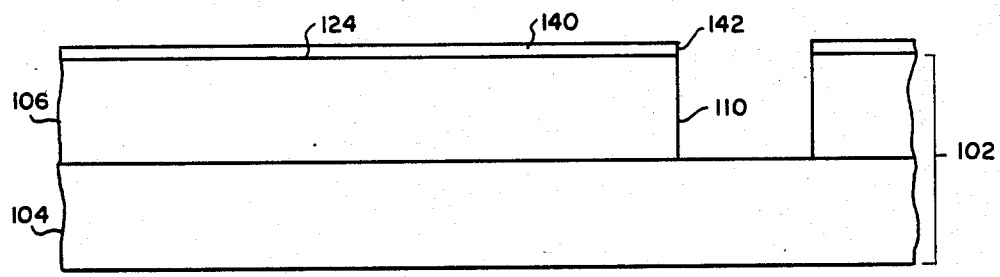
FIG. 2 is a sectional detail at one stage of element fabrication.

Referring to FIG. 2, to begin construction of the device a protective layer 140 is formed on the first major surface 124 of the isolating portion 106 of the substrate 102. The protective layer forming material can be selected from among a variety of known materials which are stable at required processing temperatures and which can be readily removed in at least selected areas. Examples of such materials are silica ($SiO_2$), silicon nitride ($Si_3N_4$), and refractory metals as well as their oxides and silicides—e.g., tungsten, tungsten oxide, and tungsten silicide. The layer need be no thicker than is required to assure pin hole free coverage of the first major surface an in any event is less than about 3000 Angstroms in thickness, preferably from about 500 to 2000 Angstroms in thickness.

Initially the protective layer overlies the entire first major surface. To locate the lasing region in the substrate an opening 142 is first formed in the protective layer, and the substrate is then etched through the opening to form the channel 110. The opening in the protective layer can be formed by conventional photomasking and etching steps. For example, the protective layer can be overcoated with a layer of a conventional photoresist, imagewise exposed, and developed to define an opening in the photoresist layer corresponding to the location of the opening in the protective layer desired. The protective layer can then be etched through the openings in the photomask to define the desired openings. A variety of suitable conventional etching techniques are known, as illustrated by the various etching techniques outlined in Sugishima et al U.S. Pat. No. 4,352,724.

After every material removal step, regardless of whether the material being removed is from the substrate itself or an associated conductive or insulative layer, it is conventional practice to follow up immediately with a washing step to assure maintenance of the high levels of cleanliness required for successful semiconductor device yields. Typically deionized water is used for washing. To avoid repetitive references to washing, it is to be understood that a washing step, though not specifically described, preferably follows each step calling for removal of any material, particularly any step calling for material removal by etching.

Since the protective layer is comparatively thin, it is normally immaterial whether isotropic or anisotropic etching conditions are employed to form the opening. The same comment does not apply to forming the channel. The side walls of the channel are shown to be perpendicular to the first major surface of the substrate. However, alternative orientations are possible and can be employed to advantage. To appreciate the alternatives some appreciation of the substrate crystal structure is required.

The Group III–V compounds which form the substrate and lasing regions all form essentially similar cubic crystal lattices of the zinc blende type, and their lattice constants are essentially similar—e.g., 5.63 Angstroms for gallium arsenide and 5.66 Angstroms for aluminum arsenide. The common crystalline class and the close similarity in lattice spacings facilitates epitaxial deposition of materials differing in the selection of aluminum or gallium as the Group III ions.

As normally prepared the major surfaces of the substrate lie in {100} crystallographic planes. By employing known etching conditions the substrate can be etched essentially isotropically through the opening in the protective layer, with a certain amount of undercutting of the protective layer occurring. Alternatively, anisotropic etching can be achieved which reduces undercutting of the protective layer. Under anisotropic etching conditions the lateral walls of the channel are defined by the more thermodynamically stable crystallographic planes of the crystal structure. The {111} crystallographic planes are the most stable and can be revealed selectively by anisotropic etching to form the side walls of the channel. Any conventional anisotropic etchant can be employed. One preferred anisotropic etchant capable of efficiently revealing {111} channel side walls is a 5:1:1 volume ratio mixture of $H_2O$:$H_2SO_4$:$H_2O_2$. Another suitable anisotropic etchant is a 2 percent by weight bromine dissolved in methanol.

The {111} crystallographic planes intersect {100} crystallographic planes at a 55° angle. Two entirely different {111} crystallographic plane channel side wall orientations are possible, as can be appreciated by reference to FIGS. 3A, 3B, and 4. FIG. 4 is an isometric detail showing two possible alternative, mutually perpendicular channel orientations. Each of the channels 110a and 110b to be formed by etching is aligned with one of two mutually perpendicular sets of <110> vectors lying in the {100} first major surface of the substrate.

Figures 3A, 3B:
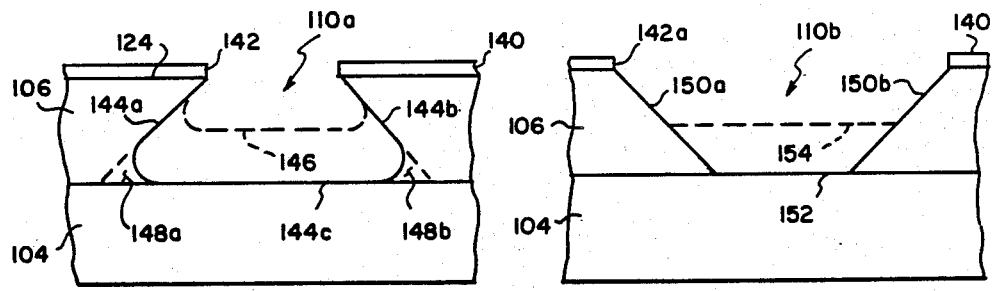
FIGS. 3A and 3B are sectional details of alternative channel configurations.
Figure 4:
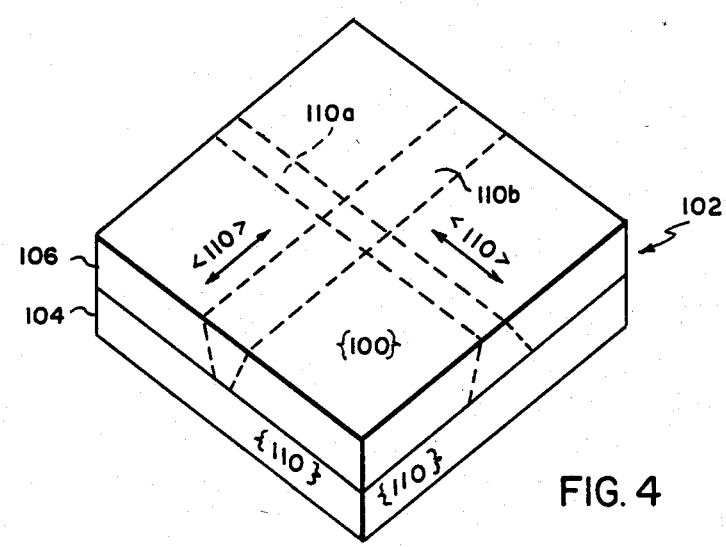
FIG. 4 is an isometric view showing alternative channel orientations.

FIG. 3A illustrates the channel side walls which result when the channel longitudinal axis is orientated parallel to one set of <110> vectors on the {100} crystallographic plane forming the first major surface while FIG. 3B illustrates the channel side walls which result when the channel longitudinal axis is oriented parallel to a second set of <110> vectors on the {100} crystallographic plane forming the first major surface, where the two sets of <110> vectors are mutually perpendicular. The direction of <110> vectors on a {100} crystal surface can be determined by light diffraction patterns on the crystal surface, as is well understood. However, discrimination between the two sets of <110> vectors for purposes of choosing the side wall orientation of the channel created by etching required a trial etching step in an expendable area of the substrate wafer being processed.

In FIG. 3A a structure is shown similar to the right hand portion of FIG. 2, with like elements assigned like reference numbers. The difference in the FIG. 3A structure is the configuration of the channel 110a. In this structure the channel is formed by two opposed side walls 144a and 144b and a bottom wall 144c. The bottom wall is shown lying along the interface of the substrate portions 104 and 106—i.e., in a {100} crystallographic plane. The side walls diverge linearly from the protective layer opening toward the substrate portion 104 and then curve back to join the bottom wall. The linear portion of each side wall lies in a different {111} crystallographic plane. Dashed line 146 shows the lower boundary of the channel at an intermediate stage of etching. From observing channel boundaries at intermediate stages of etching the manner in which the more thermodynamically stable {111} crystallographic planes define the channel side walls can be appreciated. The regions 148a and 148b, each defined by extrapolations of the lateral wall limiting {111} crystallographic plane and bottom wall defining {100} crystallographic plane, are not normally removed by etching, but should be removable if the rate of etching along the bottom wall is slowed, as by introducing an etch resistant layer in the substrate during its formation. However, the rounding of the channel side walls at their intersection with the bottom wall is advantageous in that the necessity of epitaxy at the areally constricted oblique intersections of the {111} and {100} planes is avoided, thereby facilitating epitaxy on all channel walls.

In FIG. 3B a somewhat broader opening 142a is shown, since the side walls 150a and 150b of the channel 110b converge toward the channel bottom wall 152.

Dashed line 154 represents the bottom wall at an intermediate stage of etching. It is to be noted that in this instance side walls entirely conform to {111} crystallographic planes and that the angles of intersection of the side walls and the bottom wall are obtuse, which facilitates epitaxial deposition at the intersections of the {100} and {111} crystallographic planes.

Since by definition a <110> crystallographic vector is oriented perpendicular to {110} planes, it follows that there are two sets of mutually perpendicular {110} crystallographic planes each intersecting the first major surface of the substrate at right angles. For example, in FIG. 4, two near edges of substrate are visible. Each near edge lies in a {110} crystallographic plane. Referring back to FIGS. 1 and 2 it is therefore apparent that the side walls of the channel 110 can be oriented to lie in {110} crystallographic planes. By a suitable etchant choice, it should be possible to form a channel with side walls lying in {110} crystallographic planes and a bottom wall lying in a {100} crystallographic plane. In this regard it is to be noted that the substrate surfaces formed by {110} crystallographic planes are more thermodynamically stable during etching than the surfaces formed by {100} crystallographic planes. Thus, etching would be expected to proceed anisotropically, deepening the channel bottom wall while exhibiting little undercutting of the protective layer.

Once a channel has been formed in the substrate of the desired configuration and depth, the next step is to deposit epitaxially III-V compound selectively in the channel formed so that deposition occurs only in the channel and not on the protective layer. To achieve this goal of selective site deposition of the III-V compound care must be undertaken in the choice of deposition conditions.

A preferred procedure for depositing III-V compound only on the unprotected or exposed surfaces of the substrate lying in the channel employs selected conditions of organometallic vapor phase epitaxy. The substrate in any one of the forms shown in FIGS. 2, 3A, or 3B is placed in a vacuum chamber where it is heated to a temperature in the range of from 500° to 800° C., preferably in the range of from 650° to 750° C. The pressure in the vacuum chamber is reduced to less than 50 torr., preferably less than 10 torr. At the same time an atmosphere is provided in the vacuum chamber comprised of arsine ($AsH_3$) and one or a mixture of organo-aluminum and organogallium gases—e.g., trimethyl or triethyl aluminum or gallium. The aluminum and gallium ratio are dictated by the ratio of these metals desired in the epitaxy being deposited on the substrate. A molar excess of the arsine gas is maintained. A molar ratio of vapor phase arsine to total vapor phase aluminum and gallium of from about 2:1 to 100:1 is maintained.

Deposition is continued until the epitaxy deposited in the channel forms with the first major surface of the substrate an overall planar surface—i.e., until the surface of the epitaxy in the lasing region lies within about a $\mu$m of the first major surface of the substrate, preferably within about 3000 Angstroms of the first major surface.

To provide the III-V compound being deposited in the waveguide region with the desired concentration of N or P conductivity type ions one or more N or P dopant materials are introduced into the vacuum chambers as vapor phase compounds along with the other gases. N type dopants, such as silicon, selenium, sulfur, tellurium, tin, and germanium, can be introduced as vapor phase compounds, such as silane, hydrogen selenide, germanium hydride, dialkyl telluride, or tetraalkyl tin while P type dopants, such zinc, cadmium, beryllium, and magnesium, can be introduced as the corresponding dialkyl compounds, where alkyl in each instance is independently methyl or ethyl. Except for the particular vacuum chamber conditions noted, doping procedures can generally follow the conventional practices of the art.

In depositing III-V compounds in the channel to form the various lasing region layers different crystal faces bounding the channel can affect the relative rates of epitaxial deposition. There appears to be a preference for deposition onto {111}, {100}, and {110} in that order of preference. Thus, exposed {111} crystal faces appear to accept epitaxy at a somewhat higher rate than the remaining crystal faces. In epitaxially depositing into channels bounded by {111} side walls, as shown in FIGS. 3A and 3B, this can result in some bending of the layers at their edges. Edge contouring of the various epitaxial layers can be employed to advantage, if desired. Even where edge contouring of the successive epitaxially deposited layers is observed, the contouring effect is not incompatible with obtaining the desired final planar surface configuration. Since contouring results from interaction with the substrate channel walls, once epitaxy covers these walls, the successive deposition favors restoring planarity to the upper surface of the epitaxy. Edge contours of lasing region layers can be minimized by maintaining the channel depth small in relation to its width. Where the channel is initially bounded by side walls lying in {110} crystallographic planes, the slower deposition onto walls of this crystallographic orientation favors the deposition of flat layers essentially free of edge contours, as shown in FIG. 1.

According to the preferred practice of the invention the lasing region epitaxy is grown just to or slightly below the first major surface of the substrate to form a planar surface extension of the first major surface—i.e., a surface that lies within about a $\mu$m and preferably within about 3000 Angstroms of the first major surface. Continued growth of the epitaxy within the ordinary relief tolerances of planar surfaces can be performed, but is preferably avoided. Epitaxial deposition in the lasing region above the channel results in edge bounding of the epitaxy by {111} crystallographic planes. Since such planes are canted at 55° with respect to the first major surface of the substrate, this produced an overhand that creates disadvantages in further processing to produce a completed device.

Figure 5:
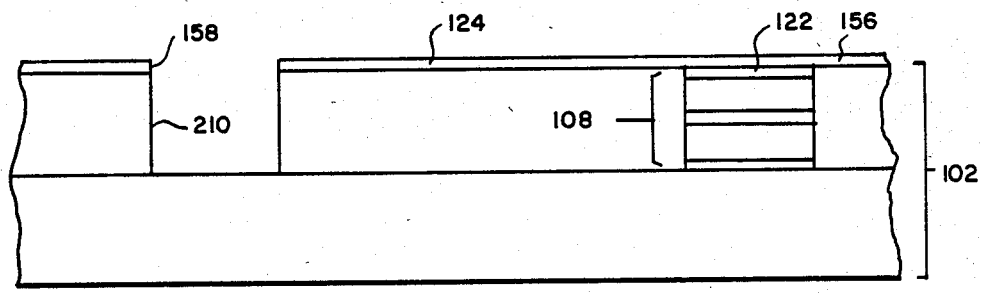
FIG. 5 is a sectional detail at a fabrication following formation of one laser and before formation of a second laser.

Once the III-V compound layers of the first lasing region have been deposited, the next objective to prevent further III-V compound epitaxy at this location while forming the second lasing region. This can be achieved merely be closing the opening 142 with additional material of the type used to form the protective layer 140. This can be done locally over the first leasing region or uniformly over the entire upper surface of the device. It is preferred first to remove the entire protective layer 140 and then, as shown in FIG. 5, to form a second protective layer 156 over the entire first major surface 124 of the substrate and the capping layer of the first lasing region. Thereafter opening 158 and channel 210 are formed similarly as described above with reference to opening 142 and channel 110.

The layers of the second lasing region 208 can then be epitaxially grown selectively in the channel 210. The layers of the second lasing region 208 can be similar to those of first lasing region, differing only by the active layer difference required to shift emission of the second lasing region with respect to emission of the first lasing region. Alternatively, the layers of the second lasing region can differ in number, thickness, and composition from those of the first lasing region, although they are selected from among the same general preferred parameter ranges noted above in discussing the first lasing region layers.

Once the lasing regions have been completed, subsequent processing to produce a completed device can be undertaken by well known, conventional techniques. The protective layer or layers used for directing epitaxy, if both are still present, can remain as permanent layers of the completed device or can be removed and replaced by an insulative layer, such as layer 130 in FIG. 1. Alternately, the insulative and protective layers can be used together. It is to be noted that the insulative layer 130 as shown in FIG. 1 covers portions of the lasing regions to limit the lateral contact of the second and third electrodes with the lasing regions. This arrangement can be used to advantage to combine gain guiding with positive index guiding. The substrate containing the lasing regions intended to form the semiconductive device is typically cleaved from a wafer of which it forms a part during fabrication so that two parallel smooth mirror edges intersect the channels containing the lasing regions. These mirror edges interact with the lasing regions to increase the emission efficiency of the completed device.

While the invention has been described with reference to certain preferred embodiments, it is appreciated that numerous modifications can be undertaken, the relative merits of which will depend upon the specific user application being addressed. For example, it is not necessary that the lasing regions contain five separate layers as shown in FIG. 1. Any one or combination of the four capping layers 114, 214, 122, and 222 shown in FIG. 1 can be omitted, the capping layers 114 and 214 being generally less determinative of overall performance than the capping layers 122 and 222.

Although only two lasing regions have been described, it is appreciated that a single substrate can contain any number of separate lasing regions, since the process of the present invention by offering the capability of selective site epitaxy allows each lasing region to be fabricated independently of other lasing regions which have been or may subsequently be formed. Semiconductive devices with from 2 to 10 different lasing regions are specifically contemplated.

It is further contemplated that waveguides other than lasers can be formed in one or more channels using procedures essentially similar to those previously described. A simple, non-lasing waveguide can be formed according to the process of this invention merely by epitaxially depositing in a channel a single III-V compound. The III-V compound can take any one of the forms described above for the various laser layers, but preferably the positive index relationship is maintained for waveguiding efficiency.

The substrate 102 has been shown to be comprised of both conductive portion 104 and isolating portion 106; however, only the isolating portion is essential. Thus, a unitary substrate can be formed in which a wafer having the composition of the isolating portion is provided and etched to form channels therein without any intervening step of epitaxially deposition additional III-V compound thereon.

The invention has been described in detail with particular reference to preferred embodiments thereof, but it will be understood that variations and modifications can be effected within the spirit and scope of the invention.

What is claimed is:

1. A process of preparing monolithically integrated lasers capable of emitting at differing wavelengths comprising providing a substrate, providing superimposed N and P conductivity type cladding layers separated by an active layer at laterally spaced lasing regions on said substrate, said substrate and said layers together forming a monocrystalline III-V compound structure, wherein the group V ions are ions of arsenic and the group III ions are ions of at least one of gallium and aluminum, and said active layers at two of said lasing regions differing to generate emissions at differing wavelengths, characterized in that at least two positive index guided lasing regions capable of emitting at differing wavelengths presenting with said substrate a planar surface of said monocrystalline III-V compound structure are formed by (a) providing a substrate having adjacent one major surface a monocrystalline gallium aluminum arsenide isolating portion having a resistivity greater than $10^5$ ohm-cm epitaxially grown on an underlying portion of said substrate, (b) providing on said one major surface a protective layer defining a first opening, (c) through the first opening creating a first channel in said substrate to expose an unprotected portion of said substrate beneath said one major surface, the first channel having walls at least in part defined by the gallium aluminum arsenide isolating portion of said substrate, (d) epitaxially depositing from a vapor phase on only said unprotected gallium aluminum arsenide isolating portion of said substrate forming the first channel a first lasing region comprised of said superimposed N and P conductivity type cladding layers separated by said active layer, said active layer being of a higher refractive index than said substrate monocrystalline gallium aluminum arsenide, (e) terminating epitaxial deposition when said first lasing region forms with said one major surface a planar surface of said III-V compound structure, (f) providing a protective layer at least in the first opening and defining a second protective layer opening laterally offset from the first opening, (g) through the second opening creating a second channel in said substrate to expose a second, laterally offset unprotected portion of said substrate beneath said one major surface, the second channel having walls at least in part defined by the gallium aluminum arsenide isolating portion of said substrate, (h) epitaxially depositing from a vapor phase on only said laterally offset unprotected gallium aluminum arsenide isolating portion of said substrate forming the second channel a second lasing region comprised of said superimposed N and P conductivity type cladding layers separated by said active layer of a higher refractive index than the substrate monocrystalline gallium aluminum arsenide, said active layer of said second laser region differing from said active layer of said first lasing region to generate emissions at a differing wavelength, and (i) terminating epitaxial deposition when said second lasing region forms with said one major surface a planar surface of said III-V compound structure.

2. A process according to claim 1 wherein said underlying portion of said substrate is more conductive than said isolating portion of said substrate and at least one of said channels extends into said substrate to said more conductive underlying portion.

3. A process a;according to claim 2 in which said first major surface of said substrate presents a {100} crystal face and a longitudinal axis of each channel is formed along a <110> vector.

4. A process according to claim 3 in which at least one of the channels is formed with side walls lying in {111} crystal planes.

5. A process according to claim 4 in which said {111} side walls diverge in a direction away from said substrate surface.

6. A process according to claim 4 in which said {111} side walls converge in a direction away from said substrate surface.

7. A process according to claim 1 in which gallium arsenide or gallium aluminum arsenide is selectively deposited in each of the channels by a vapor phase double decomposition reaction of arsenic, gallium, and, when gallium aluminum arsenide is being selectively deposited, aluminum compounds at a temperature of from 500° to 800° C. from an atmosphere of less than 50 torr.

8. A process according to claim 7 in which epitaxial deposition is undertaken at a pressure of less than 10 torr.

9. A process according to claim 7 in which epitaxial deposition is undertaken at a temperature of from 650° to 750° C.

10. A process according to claim 1 in which gallium arsenide or gallium aluminum arsenide is selectively deposited epitaxially in each of the channels by a vapor phase double decomposition reaction of arise and at least one member selected from the group consisting of trialkyl gallium and trialkyl aluminum, where alkyl is independently methyl or ethyl.

11. A process according to claim 1 in which said substrate portion separating adjacent lasing regions exhibits a resistivity of greater than $10^7$ ohm-cm.

12. A process according to claim 1 in which said lasing regions are each comprised of N and P conductivity type cladding regions of aluminum arsenide or gallium aluminum arsenide containing from $10^{16}$ to $10^{18}$ conductivity imparting ions per cubic centimeter and an intervening active layer of gallium arsenide or gallium aluminum arsenide containing less aluminum than either of said cladding regions and less aluminum than at least that portion of said substrate contiguous therewith.

13. A process according to claim 1 in which at least one protective layer is formed of silica or silicon nitride.

14. A process according to claim 1 in which epitaxial deposition of each of said lasing regions is terminated within less than a micrometer of said one major surface of the substrate.

15. A process according to claim 14 in which epitaxial deposition of each of said lasing regions is terminated within less than 3000 Angstroms of said one major surface of said substrate.

16. A process according to claim 1 wherein said first lasing region is formed by providing said underlying substrate portion with a conductivity imparting ion concentration of from $1 \times 10^{18}$ to $3 \times 10^{18}$ ions per cubic centimeter, epitaxially growing on said underlying substrate portion said isolating substrate portion comprised of gallium aluminum arsenide containing from 30 to 60 mole percent aluminum and having a resistivity greater than $10^7$ ohm-cm, said isolating substrate portion forming said one major surface of the substrate, providing on said one major surface a protective layer of silica or silicon nitride defining an opening, through the opening creating a first channel in the substrate extending through said isolating substrate portion to said underlying substrate portion to expose an unprotected portion of said substrate beneath said one major surface, forming a laser waveguide region by selectively depositing epitaxially in only the first channel rather than on the protective layer in sequence a first gallium arsenide layer having a first conductivity ion concentration of from $10^{17}$ to $5 \times 10^{18}$ ions per cc, a first cladding layer comprised of aluminum arsenide or gallium aluminum arsenide containing at least 90 mole percent aluminum having a first conductivity type ion concentration of from $10^{16}$ to $10^{18}$ ions per se, an active layer comprised of gallium arsenide having a substantially lower conductivity imparting ion concentration than said first cladding layer, a second cladding layer comprised of aluminum arsenide or gallium aluminum arsenide containing at least 90 mole percent aluminum having a second conductivity type ion concentration of from $10^{16}$ to $10^{18}$ ions per cc, and a surface gallium arsenide layer having a second conductivity type ion concentration of greater than $10^{19}$ ions per cc, epitaxially depositing the laser waveguide layers selectively in the first channel by conducting deposition at a temperature in the range of from 650° to 750° C. at a pressure of less than 10 torr. from an atmosphere comprised of arsine gas and at least one of trialkyl aluminum and trialkyl gallium gas, alkyl being independently in each occurrence selected from methyl and ethyl, with the ratio of arsine to remaining gas being from 10:1 to 30:1, and terminating epitaxial deposition with the surface gallium arsenide layer lying at or beneath said first major surface by a distance of less than 3000 Angstroms to form a planar surface therewith, so that said lasing region acts as a wave propagation medium, said epitaxially deposited substrate portion acts as a lateral isolation medium for the waveguide region, and said waveguide region and said substrate one major surface form a planar surface of said III-V compound structure.

* * * * *